United States Patent
Lu et al.

(10) Patent No.: US 12,266,683 B2
(45) Date of Patent: Apr. 1, 2025

(54) CAPACITOR STRUCTURE AND METHOD OF MANUFACTURING SAME, AND MEMORY

(71) Applicant: CHANGXIN MEMORY TECHNOLOGIES, INC., Hefei (CN)

(72) Inventors: Yong Lu, Hefei (CN); Gongyi Wu, Hefei (CN); Hongkun Shen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 736 days.

(21) Appl. No.: 17/401,502

(22) Filed: Aug. 13, 2021

(65) Prior Publication Data
US 2022/0037459 A1 Feb. 3, 2022

Related U.S. Application Data

(63) Continuation of application No. PCT/CN2021/097117, filed on May 31, 2021.

(30) Foreign Application Priority Data

Jul. 30, 2020 (CN) .......................... 202010752934.6

(51) Int. Cl.
*H01G 4/06* (2006.01)
*H01G 4/008* (2006.01)
(Continued)

(52) U.S. Cl.
CPC ............. *H01L 28/60* (2013.01); *H01G 4/008* (2013.01); *H01G 4/012* (2013.01); *H01G 4/06* (2013.01);
(Continued)

(58) Field of Classification Search
CPC ........ H01L 28/60; H01G 4/012; H10B 12/30; H10B 12/033; H10B 12/315; H10B 12/0335; H10B 12/053; H10B 12/318
See application file for complete search history.

(56) References Cited

U.S. PATENT DOCUMENTS

| 5,712,202 A | * | 1/1998 | Liaw | H10B 12/033 438/398 |
| 5,869,861 A | * | 2/1999 | Chen | H01L 28/91 365/174 |

(Continued)

FOREIGN PATENT DOCUMENTS

| CN | 1050695 C | 3/2000 |
| CN | 105706239 A | 6/2016 |

(Continued)

OTHER PUBLICATIONS

Jae-Man Yoon, "A Novel Low Leakage Current VPT(Vertical Pillar Transistor) Integration for 4F2 DRAM Cell Array with sub 40 nm Technology", 0-7803-9749-5/06/$20.00 © 2006 IEEE.
(Continued)

*Primary Examiner* — Britt D Hanley
*Assistant Examiner* — Victor V Barzykin
(74) *Attorney, Agent, or Firm* — Kilpatrick Townsend & Stockton LLP

(57) ABSTRACT

A capacitor structure and a method of manufacturing the same, and a memory are provided. The method includes the following operations. A substrate is provided. A first conductive structure with a shape of column is formed on the substrate. A second conductive structure is formed on the substrate. The second conductive structure surrounds the first conductive structure and is spaced with the first conductive structure. The first conductive structure and the second conductive structure together form a bottom electrode. A capacitor dielectric layer is formed. The capacitor (Continued)

dielectric layer covers the surface of the substrate and the surface of the bottom electrode. A top electrode covering the surface of the capacitor dielectric layer is formed.

14 Claims, 14 Drawing Sheets

(51) Int. Cl.
    *H01G 4/012*      (2006.01)
    *H01G 4/12*      (2006.01)
    *H01G 4/33*      (2006.01)
    *H01L 49/02*      (2006.01)
    *H10B 12/00*      (2023.01)

(52) U.S. Cl.
    CPC ............. *H01G 4/1272* (2013.01); *H01G 4/33* (2013.01); *H01L 28/90* (2013.01); *H10B 12/03* (2023.02); *H10B 12/30* (2023.02); *H01G 4/1218* (2013.01); *H01G 4/1236* (2013.01); *H10B 12/033* (2023.02)

(56) References Cited

U.S. PATENT DOCUMENTS

| | | | | |
|---|---|---|---|---|
| 6,071,774 | A * | 6/2000 | Sung ................... | H10B 12/033 |
| | | | | 438/398 |
| 10,157,978 | B2 * | 12/2018 | Oganesian .............. | H01L 28/40 |
| 10,170,541 | B2 | 1/2019 | Yi et al. | |
| 10,276,668 | B2 | 4/2019 | Kim | |
| 10,490,623 | B2 | 11/2019 | Yi et al. | |
| 10,629,600 | B2 | 4/2020 | Kim et al. | |
| 10,879,345 | B2 | 12/2020 | Yi et al. | |
| 2005/0230729 | A1 * | 10/2005 | Won ................... | H10B 12/033 |
| | | | | 257/296 |
| 2006/0097299 | A1 * | 5/2006 | Ahn .................. | H01L 21/02178 |
| | | | | 257/295 |
| 2006/0234510 | A1 * | 10/2006 | Iijima .................... | H10B 12/09 |
| | | | | 438/689 |
| 2009/0197384 | A1 * | 8/2009 | Iijima .................... | H10B 12/09 |
| | | | | 438/386 |
| 2012/0146182 | A1 * | 6/2012 | Oganesian .............. | H01L 28/91 |
| | | | | 257/532 |
| 2012/0235279 | A1 * | 9/2012 | Seo .......... | H01L 28/90 |
| | | | | 257/532 |
| 2013/0228837 | A1 * | 9/2013 | Sukekawa ............. | H10B 12/09 |
| | | | | 257/532 |
| 2013/0299942 | A1 * | 11/2013 | Park ....................... | H01L 28/91 |
| | | | | 257/532 |
| 2017/0025416 | A1 * | 1/2017 | Han ..................... | H10B 12/053 |
| 2017/0345886 | A1 | 11/2017 | Yi et al. | |
| 2018/0166542 | A1 * | 6/2018 | Kim ...................... | H10B 12/00 |
| 2019/0131386 | A1 | 5/2019 | Yi et al. | |
| 2019/0189617 | A1 | 6/2019 | Kim et al. | |
| 2019/0378657 | A1 * | 12/2019 | Lu ......................... | H01G 4/232 |
| 2020/0083319 | A1 | 3/2020 | Yi et al. | |
| 2020/0243532 | A1 | 7/2020 | Kim et al. | |
| 2020/0286687 | A1 * | 9/2020 | Lin ......................... | H01G 7/06 |
| 2021/0057518 | A1 | 2/2021 | Yi et al. | |
| 2021/0273041 | A1 * | 9/2021 | Kang ................. | H10B 12/0335 |

FOREIGN PATENT DOCUMENTS

| | | |
|---|---|---|
| CN | 108074995 A | 5/2018 |
| CN | 108183097 A | 6/2018 |
| CN | 108550568 A | 9/2018 |
| CN | 110021582 A | 7/2019 |
| CN | 209183578 U | 7/2019 |

OTHER PUBLICATIONS

Ki-Whan Song, "A 31 ns Random Cycle VCAT-Based 4F2 DRAM With Manufacturability and Enhanced Cell Efficiency", IEEE Journal of Solid-State Circuits, vol. 45, No. 4, Apr. 2010.

* cited by examiner

CAPACITOR STRUCTURE AND METHOD OF MANUFACTURING SAME, AND MEMORY

CROSS-REFERENCE TO RELATED APPLICATIONS

The present application is a U.S. continuation application of International Application No. PCT/CN2021/097117, filed on May 31, 2021, which claims priority to Chinese Patent Application No. 202010752934.6, filed on Jul. 30, 2020. International Application No. PCT/CN2021/097117 and Chinese Patent Application No. 202010752934.6 are incorporated herein by reference in their entireties.

TECHNICAL FIELD

The present application relates to the technical field of a semiconductor memory, and more particularly, to a capacitor structure and a method of manufacturing the same, and a memory.

BACKGROUND

A Dynamic Random Access Memory (DRAM) includes a capacitor for storing a charge and a transistor for accessing the capacitor. The DRAM stores data in the form of the charge on the capacitor. So it is necessary to recharge the capacitor regularly every several milliseconds. The larger the capacitance of the capacitor, the longer the data may be maintained in the DRAM.

In order to obtain more chips on a wafer, one method is to miniaturize the size, and another method is to change a memory structure. Currently, the DRAM is mainly a 6F2 structure. When the size is miniaturized to a certain level, a 4F2 structure will open up a new era. In the 4F2 structure, a capacitor structure is also changed correspondingly. Currently, a stacked capacitor is predominant. As the size becomes smaller and smaller, a columnar Three-Dimensional (3D) capacitor structure will become the major trend. However, currently, since the thickness of an electrode is relatively small when the columnar 3D capacitor structure is formed, bending or collapsing is prone to occur when being pressed.

SUMMARY

In one embodiment, a method of manufacturing a capacitor structure is provided. The method includes the following operations.

A substrate is provided.

A first conductive structure with a shape of column is formed on the substrate.

A second conductive structure is formed on the substrate. The second conductive structure surrounds the first conductive structure and is spaced with the first conductive structure. The first conductive structure and the second conductive structure together form a bottom electrode.

A capacitor dielectric layer is formed. The capacitor dielectric layer covers a surface of the substrate and a surface of the bottom electrode.

A top electrode covering a surface of the capacitor dielectric layer is formed.

In one embodiment, a capacitor structure is provided. The capacitor structure includes a substrate, a bottom electrode, a capacitor dielectric layer, and a top electrode.

The bottom electrode includes a first conductive structure and a second conductive structure which are located on a surface of the substrate. The first conductive structure has a shape of column. The second conductive structure surrounds the first conductive structure and is spaced with the first conductive structure.

The capacitor dielectric layer is located on the surface of the substrate and a surface of the bottom electrode.

The top electrode is located on a surface of the capacitor dielectric layer.

In one embodiment, a memory comprising the capacitor structure as described in any one of the above embodiments is provided.

BRIEF DESCRIPTION OF THE DRAWINGS

In order to describe the technical solutions in the embodiments of the present application or in the related art more clearly, a simple introduction on the accompanying drawings which are needed in the description of the embodiments or related art is given below. Apparently, the accompanying drawings in the description below are merely some of the embodiments of the disclosure. Other drawings may be obtained based on the accompanying drawings by a person having ordinary skill in the art without any creative effort.

Figure 1:
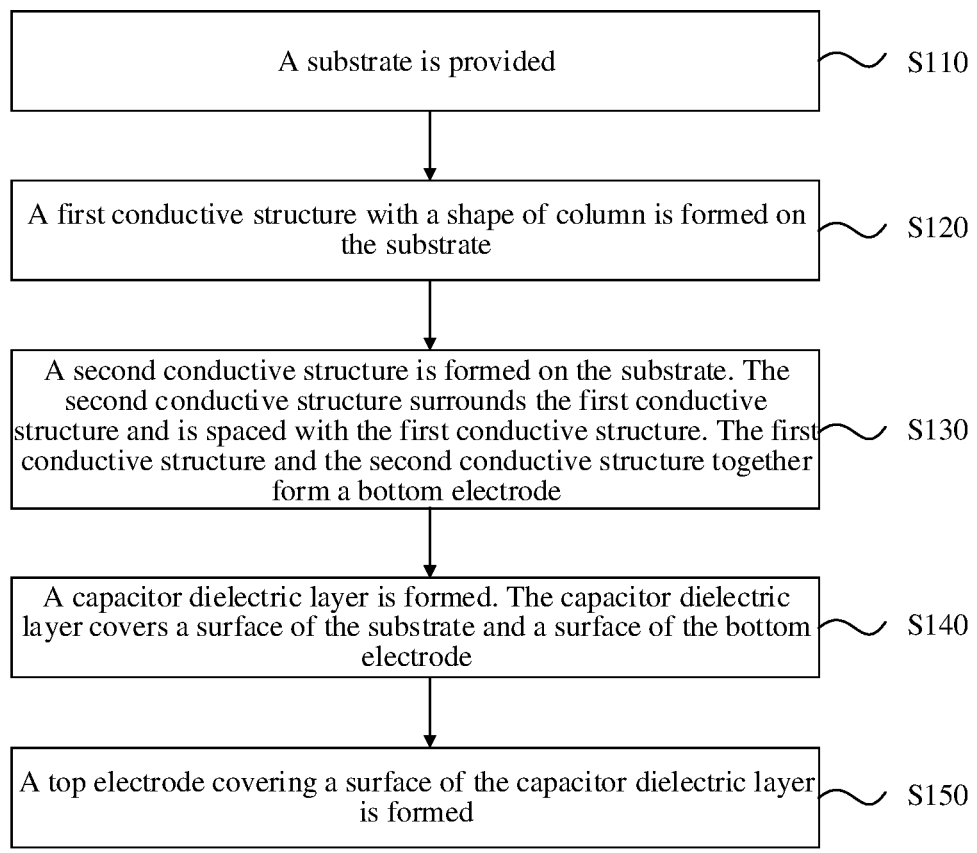
FIG. 1 is a flow chart of a method of manufacturing a capacitor structure according to one embodiment.

Description of reference numerals: substrate—100, bottom electrode—200, first conductive structure—210, first conductive material layer—210a, second conductive structure—220, second conductive material layer—220a, capacitor dielectric layer—300, bottom electrode—400, capacitor contact material layer—500a, capacitor contact pad—500, hard mask layer—600, first organic mask material layer—610, first hard mask material layer—620, first photoresist layer—630, second hard mask material layer—640, and sacrificial material layer—700.

DETAILED DESCRIPTION

To facilitate understanding of the present application, the present application will be described below in detail with reference to the accompanying drawings. Embodiments of the present application are shown in the accompanying drawings. However, the present application may be implemented in many different forms and should not be construed as limited to the embodiments set forth herein. Rather, a purpose of providing these embodiments is to make the disclosure of the present application more detailed and comprehensive.

Unless defined otherwise, each of the technical and scientific terms used herein has the same meaning as commonly understood by a person having ordinary skill in the art to which the present application pertains. The terms used herein in the specification of the present application are for the purpose of describing specific embodiments only and are not intended to limit the present application.

Spatial relation terms such as "under", "underneath", "lower", "below", "above", "upper", and the like, may be used herein to describe a relation between one element or feature and another element or feature as illustrated in the figures. It is to be understood that in addition to the orientation shown in the figures, the spatial relation terms further include different orientations of a device in use and operation. For example, if the device in the figures is turned over, the element or feature described as "underneath the other element" or "below it" or "under it", the element or feature will be oriented "above" the other element or feature. Therefore, the exemplary terms "under" and "below" may include both "under" and "above" orientations. In addition, the device may also include additional orientations (for example, rotating 90 degrees or other orientations), and the spatial descriptors used herein are interpreted accordingly.

The embodiments of the disclosure are described herein with reference to schematic sectional views of ideal embodiments (and intermediate structures) of the present application, so that it is expected that changes in the shown shape may occur due to for example a manufacturing technique and/or a tolerance. Hence, the embodiments of the present application should not be limited to special shapes of regions shown herein but include shape deviations caused by the manufacturing technique. Therefore, the regions shown in the figures are substantially schematic, and shapes thereof neither represent actual shapes of the regions of the device nor limit the scope of the present application.

Referring to FIG. 1, one embodiment of the present application provides a method of manufacturing a capacitor structure, including the following operations.

At S110, a substrate 100 is provided.

At S120, a first conductive structure 210 with a column shape is formed on the substrate 100.

At S130, a second conductive structure 220 is formed on the substrate 100. The second conductive structure 220 surrounds the first conductive structure 210 and is spaced with the first conductive structure 210. The first conductive structure 210 and the second conductive structure 220 together form a bottom electrode 200.

At S140, a capacitor dielectric layer 300 is formed. The capacitor dielectric layer 300 covers a surface of the substrate 100 and a surface of the bottom electrode 200.

At S150, a top electrode 400 covering a surface of the capacitor dielectric layer 300 is formed.

It will be understood that at present, when a columnar capacitor structure is manufactured, a stacked structure is formed first. The stacked structure includes an upper supporting layer, a lower supporting layer, and a filling layer located between the two supporting layers. A capacitor hole is formed in the stacked structure. Then, a bottom electrode is formed on the surface of the capacitor hole by a deposition process. Next, the filling layer is removed and a dielectric material layer covering the surface of the bottom electrode is formed. Finally, a gap between the dielectric material layers is filled to form the top electrode. However, after the filling layer is removed, bending or collapsing is prone to occur in a subsequent manufacturing procedure, since the thickness of the bottom electrode is relatively small. In order to solve the problem, in the embodiment, the first conductive structure 210 with a shape of column is formed first. Then the second conductive structure 220 surrounding the first conductive structure 210 is formed. Finally, the capacitor dielectric layer 300 covering the surface of the substrate 100 and the surface of the bottom electrode 200, and the top electrode 400 covering the surface of the capacitor dielectric layer 300 are formed in sequence. Since the first conductive structure 210 with a shape of column is relatively straight and is relatively large in size and has a high bearing capability, the first conductive structure with a shape of column will not collapse or bend in a subsequent manufacturing procedure. Moreover, the subsequently formed top electrode 400/bottom electrode 200 may be prevented from collapsing or bending caused by pressing. In addition, the top electrode 400, the bottom electrode 200, and the capacitor dielectric layer 300 together form a Three-Dimensional (3D) columnar capacitor, so that the relative area between the top electrode 400 and the bottom electrode 200 may be effectively increased, and accordingly the capacitance of the capacitor structure is increased.

In the embodiment, the substrate 100 includes, but is not limited to, a silicon base, an epitaxial silicon base, a silicon germanium base, a silicon carbide base, or a silicon-on-insulator base. A person having ordinary skill in the art may select a type of the semiconductor substrate 100 according to a semiconductor device to be formed on the substrate 100. Therefore, the type of the semiconductor substrate 100 should not limit the protection scope of the present application. In the embodiment, the substrate 100 is a P-type crystalline silicon substrate.

The substrate 100 includes a base and a shallow trench structure formed in the base. Through the shallow trench structure, multiple active regions that are parallel and staggered are defined. An insulating material is filled in the shallow trench structure to form a shallow trench isolation structure. The substrate 100 further includes a word line structure and a bit line structure. The word line structure is a buried word line structure. The extension direction of the buried word line structure is crossed with the extension direction of the bit line structure.

Figure 2:
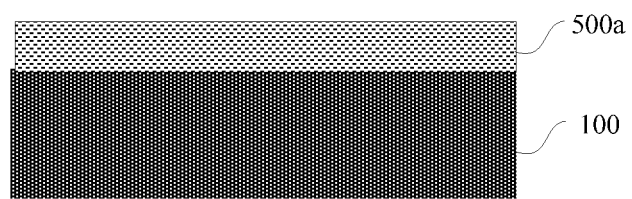
FIG. 2 to FIG. 14 are schematic diagrams of capacitor structures which are gradually formed according to one embodiment.

Referring to FIG. 2, in order to reduce the contact resistance between the capacitor structure and the substrate 100, before the first conductive structure 210 is formed, the method further includes an operation that a capacitor contact material layer 500a covering the surface of the substrate 100 is formed.

In the embodiment, a conductive material, such as one or more of titanium nitride, titanium, tungsten silicide, or tungsten nitride, is deposited on the surface of the substrate by a deposition process. The capacitor contact material layer 500a is formed on the surface of the substrate 100. The deposition processes may include Chemical Vapor Deposition (CVD), Low Pressure CVD (LPCVD), Plasma Enhanced CVD (PECVD), Atomic Layer Deposition (ALD), and Plasma Enhanced ALD (PEALD), and the like. After the first conductive structure, the sacrificial material layer, and the second conductive structure are formed on the capacitor contact material layer, the capacitor contact material layer 500a is etched until the substrate 100 is exposed. The capacitor contact material layer 500a which is remained forms a capacitor contact pad. Positions and number of the capacitor contact pads correspond to those of the first conductive structures in a one-to-one manner.

In one embodiment, the operation that the first conductive structure 210 with a shape of column is formed on the substrate 100 includes the following operations.

A first conductive material layer 210a is formed on the surface of the substrate 100.

A hard mask layer 600 is formed on the first conductive material layer 210a. The hard mask layer 600 has a first graphical target pattern defining the first conductive structure 210.

The first conductive material layer 210a is etched with the hard mask layer 600 as a mask to form a plurality of first conductive structures 210 with a shape of column.

Referring to FIG. 3 to FIG. 8, in the embodiment, in order to ensure the etching accuracy, a photoetching process is used once, and a dry etching process is used for two times. The specific operations are as follows.

Figure 3:
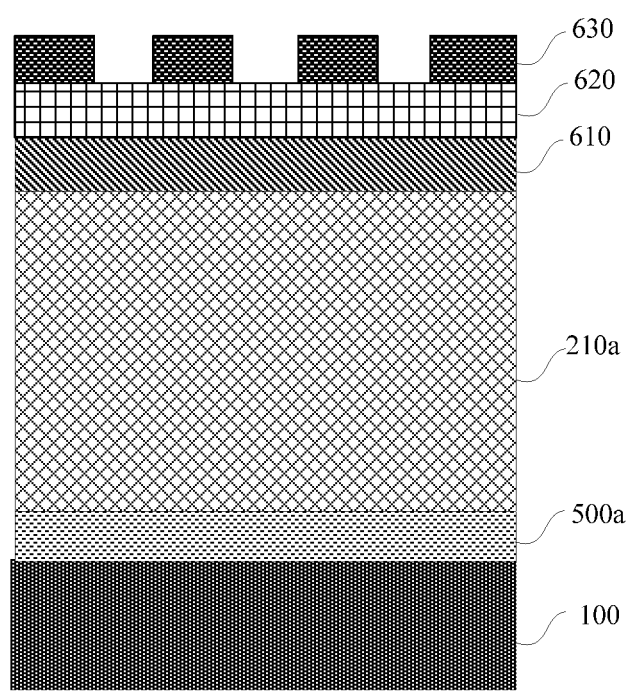
Figure 4:
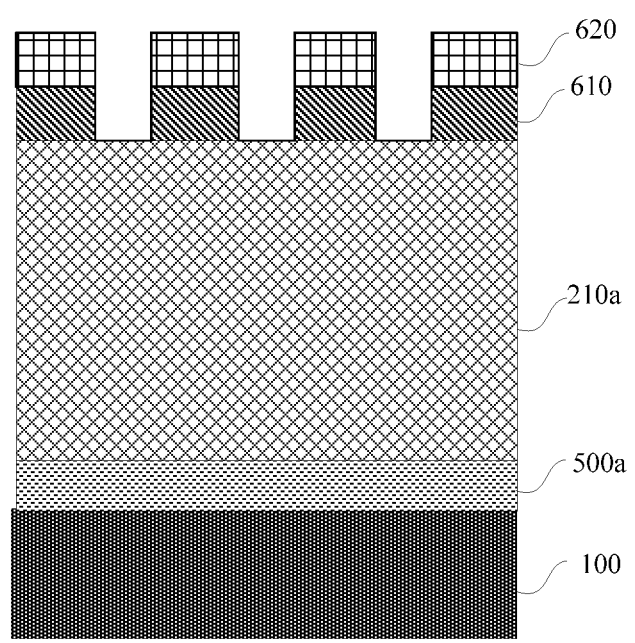

At operation 1, the first conductive material layer 210a, a first organic mask material layer 610, and a first hard mask material layer 620 are formed in sequence by the deposition process on the substrate 100, on which the capacitor contact material layer 500a has been formed. A layer of photoresist is coated on the surface of the first hard mask material layer to form a photoresist layer 630. A material of the first hard mask material layer 620 may be nitride, oxide, such as silicon oxynitride, silicon oxide-carbon, and the like. The first organic mask material layer 610 may be an anti-reflection material, an organic carbon material, and the like. Next, steps such as exposing and cleaning are performed on the photoresist layer 630 to form the first graphical target pattern defining the first conductive structure 210. Again, the first organic mask material layer and the first hard mask material layer are etched with the photoresist layer 630 as the mask until the first conductive material layer 210a is exposed. The first graphical target pattern of the first conductive structure 210 is transferred into the first organic mask material layer 610 and the first hard mask material layer 620. A through-hole penetrating through the first organic mask material layer 610 and the first hard mask material layer 620 is formed. The remained photoresist is removed. Reference is made to FIG. 3 and FIG. 4.

Figure 5:
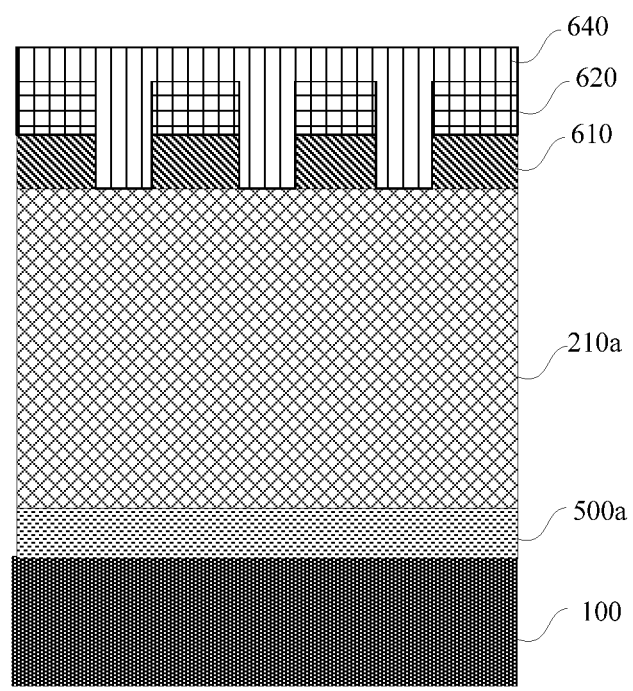
Figure 6:
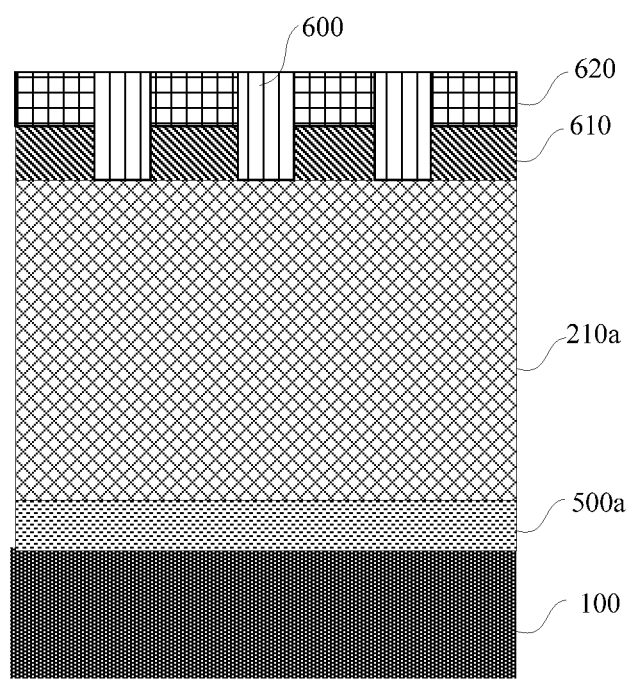
Figure 7:
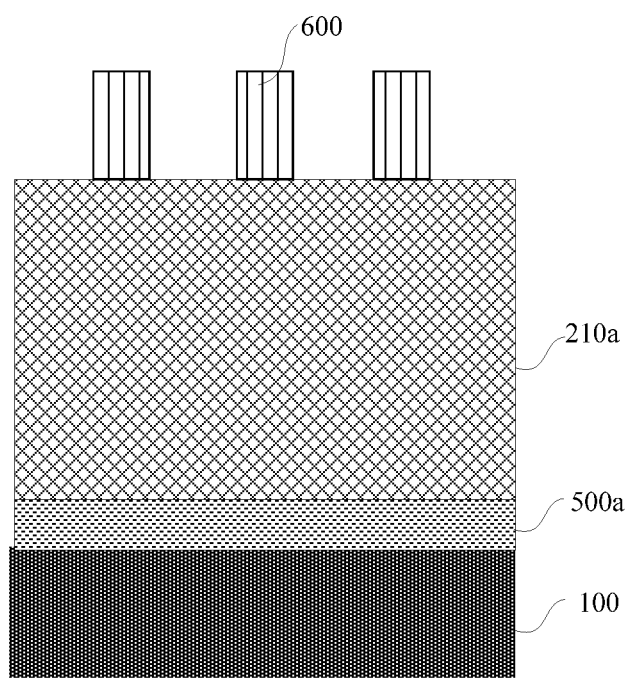

At operation 2, a second hard mask material layer 640 is formed by the deposition process. The second hard mask material layer 640 fills the through-hole penetrating through the first organic mask material layer 610 and the first hard mask material layer 620 and covers the surface of the first hard mask material layer 620. Then, the second hard mask material layer 640 covering the surface of the first hard mask material layer 620 is removed by an etching process or a chemical mechanical polishing process. Finally, the first organic mask material layer 610 and the first hard mask material layer 620 are removed by using an organic solvent, and the second hard mask material layer 640 which is remained is used as the hard mask layer 600. The hard mask layer 600 has the first graphical target pattern defining the first conductive structure 210. Reference is made to FIG. 5 to FIG. 7.

Figure 8:
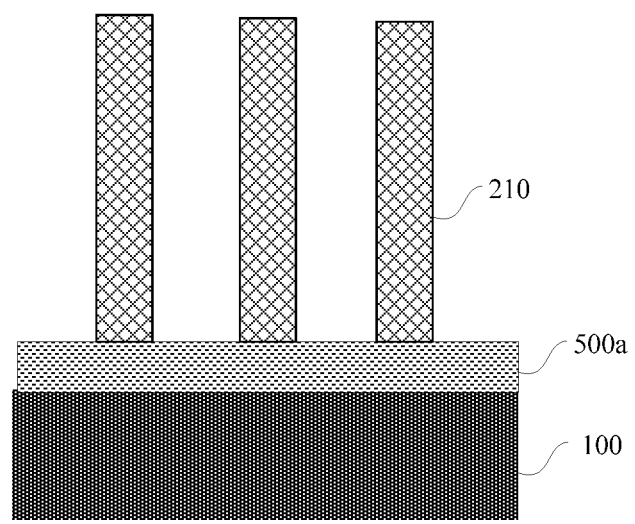

At operation 3, the first conductive material layer 210a is etched with the hard mask layer 600 as the mask to form the first conductive structure 210. Reference is made to FIG. 8.

In addition, in some other embodiments, the hard mask material layer and anti-reflection material layer may also be formed on the first conductive material. Then the photoresist layer is formed on the surface of the anti-reflection material layer. The first graphical target pattern of the first conductive structure 210 is defined in the photoresist layer by a photoetching patterning process. The hard mask material layer and the anti-reflection material layer are etched with the patterned photoresist layer as the mask until the first conductive material layer 210a is exposed. Finally, the photoresist layer and the anti-reflection material layer are removed, and the remained hard mask material layer is used as the hard mask layer 600. The first conductive material layer 210a is etched with the hard mask layer 600 as the mask to form the first conductive structure 210.

In one embodiment, the first conductive structure 210 is cylindrical, and the diameter of the bottom surface of the first conductive structure 210 is 30 nm-50 nm. It will be understood that the first conductive structure 210 with a cylindrical shape is beneficial to increase the number of the capacitor structure in the capacitor structure. In other embodiments, a cross-section of the first conductive structure 210 may be rectangle, square, triangle, or irregularly shape. In the embodiment, generally, the organic mask material layer and the hard mask material layer are etched by using a vertically crossed strip-shaped mask structure as a hard mask to form the through-hole. However, due to the limitation of the etching process, the cross section of the through-hole formed thereby is typically circular during pattern transferring. In addition, by controlling the diameter of the bottom surface of the first conductive structure 210 to be in the range of 30 nm-50 nm, the first conductive structure 210 is prevented from bending or collapsing due to excessive thinness, and the capacitance of the capacitor structure is increased maximally.

In one embodiment, the first conductive structure 210 is formed by using a polycrystalline silicon material. It will be understood that any conductive metal material or semiconductor conductive material may be used for forming the capacitor electrode. In the embodiment, since the thickness of the first conductive material layer 210a to be formed is relatively large and the deposition speed of the polycrystalline silicon material is much greater than that of other common conductive material, the polycrystalline silicon material is used to form the first conductive structure 210 to reduce a manufacturing cycle.

In one embodiment, the operation that the second conductive structure 220 is formed on the substrate 100 includes the following operations.

A sacrificial material layer 700 is formed. The sacrificial material layer 700 covers a side surface of the first conductive structure 210.

A second conductive material layer 220a covering the side surface of the sacrificial material layer 700 is formed.

The sacrificial material layer 700 located on the side surface of the first conductive structure 210 is removed, and the remained second conductive material layer 220a is used as the second conductive structure 220.

In the embodiment, the operation that the second conductive structure 220 is formed includes the following operations.

Figure 9:
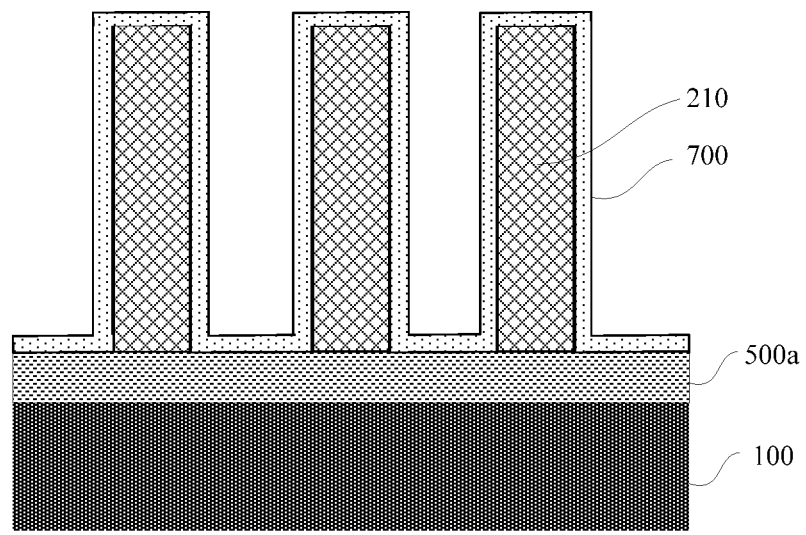

1) The sacrificial material layer 700 is formed by the deposition process. The sacrificial material layer 700 covers the surface of the substrate 100 and the first conductive structure 210, referring to FIG. 9. In an implementation process, the sacrificial material layer 700 may be formed by using an insulating material such as silicon oxide, silicon nitride, silicon oxynitride, and the like. In the embodiment, the sacrificial material layer 700 is specifically formed by using silicon oxide material.

Figure 10:
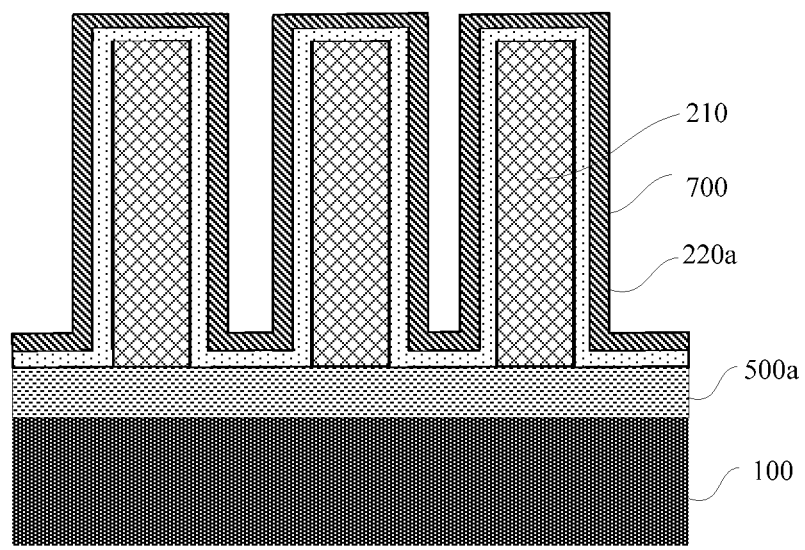

2) The second conductive material layer 220a covering the surface of the sacrificial material layer 700 is formed by depositing one or more of titanium nitride, titanium, tungsten silicide, tungsten nitride using the deposition process, referring to FIG. 10. In the embodiment, the second conductive material layer 220a is specifically formed by using titanium nitride to increase the conductivity of the second conductive material layer 220a.

3) The second conductive material layer 220a and the sacrificial material layer 700 are etched by the dry etching process, to remove the second conductive material layer 220a and the sacrificial material layer 700 located on the top of the first conductive structure 210 and the surface of the capacitor contact material layer 500a and remain the second conductive material layer 220a and the sacrificial material layer 700 located on the side surface of the first conductive structure 210.

Figure 11:
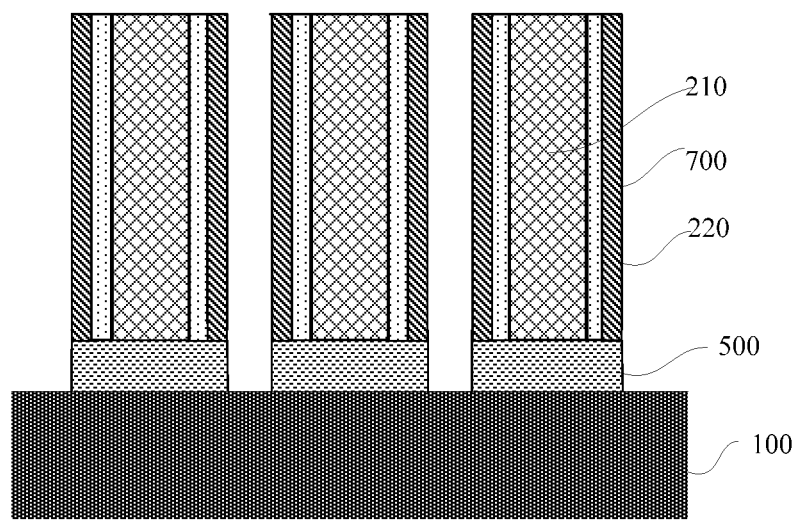

4) A capacitor basic material layer is etched with the first conductive structure 210, the remained second conductive material layer 220a and the sacrificial material layer 700 as a mask, until the substrate 100 is exposed. The remained capacitor contact material layer 500a forms the capacitor contact pad 500. By means of the capacitor contact pad 500, the contact resistance between the capacitor structure and the substrate 100 is reduced, referring to FIG. 11.

Figure 12:
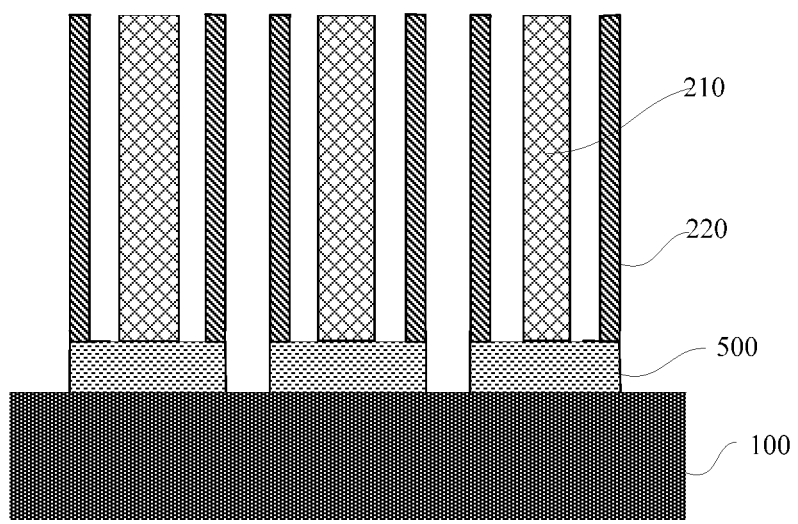

5) The sacrificial material layer 700 is removed, referring to FIG. 12.

In the embodiment, a cross-section of the second conductive structure is annular. The second conductive structure surrounds the first conductive structure 210. The distance between adjacent two of the first conductive structures 210 is not smaller than twice the sum of the thickness of the sacrificial material layer 700 and the second conductive material layer 220a, so that after the sacrificial material layer is formed, a depth-to-width ratio of a gap for forming the second conductive material layer 220a between the sacrificial material layers is prevented from being too large and generating air intervals to influence the conductivity of the second conductive material layer 220a. Based on this, in the embodiment, the second conductive material layer 220a is formed by using an atomic layer deposition technique. It will be understood that the atomic layer deposition technique is a method of plating a substance on the surface of the substrate layer by layer in the form of a monoatomic film. Relative to common chemical deposition, the surface of the second conductive material layer 220a formed by using the atomic layer deposition technique has extremely uniform film thickness and uniformity.

In one embodiment, the material of the second conductive structure 220 and the bottom electrode 200 is one or more of titanium, titanium nitride, or tungsten. Since titanium nitride has good stability and conductivity, in the embodiment, the second conductive structure 220 and the top electrode 400 are formed by using titanium nitride. Moreover, as the second conductive structure 220 and the top electrode 400 are formed by using the same material, it is benefit for the material management, a process design is simplified, and the production cost is reduced.

In one embodiment, the sacrificial material layer 700 on the side surface of the first conductive structure 210 is removed by using a wet etching process.

In the embodiment, the sacrificial material layer 700 is removed by using hydrofluoric acid HF. In the embodiment, since the sacrificial material layer 700 has the relatively high selective etching ratio relative to the bottom electrode 200, the capacitor contact material layer 500a, and the substrate 100, the etching of the bottom electrode 200, the capacitor contact material layer 500a and the substrate 100 may be ignorable during removing the sacrificial material layer 700 by using the hydrofluoric acid HF.

Figure 13:
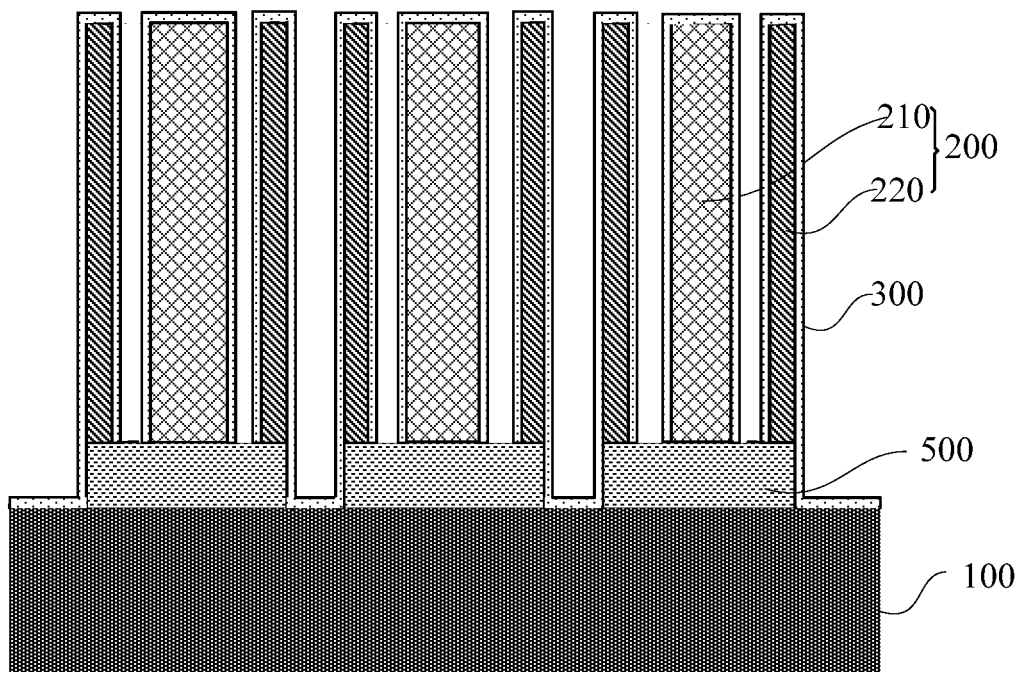

Referring to FIG. 13, after the bottom electrode 200 is formed, a dielectric material is deposited by using the deposition process to form the capacitor dielectric layer 300. The capacitor dielectric layer 300 covers the surfaces of the first conductive structure 210, the second conductive structure 220, the capacitor contact pad 500, and the substrate 100.

In one embodiment, the capacitor dielectric layer 300 is formed by a dielectric material having a dielectric constant greater than 7. It will be understood that when the relative area between the top electrode 400 and the bottom electrode 200 is determined, the capacitance may be increased by increasing a dielectric coefficient of the capacitor dielectric layer 300 between the top electrode 400 and the bottom electrode 200. Therefore, the capacitor dielectric layer 300 in the embodiment is formed by using the dielectric material having the dielectric constant greater than 7. The common high-K dielectric material includes $Ta_2O_5$, $TiO_2$, $Al_2O_3$, $Pr_2O_3$, $La_2O_3$, $LaAlO_3$, $HfO_2$, $ZrO_2$, or metal oxides of other components.

Figure 14:
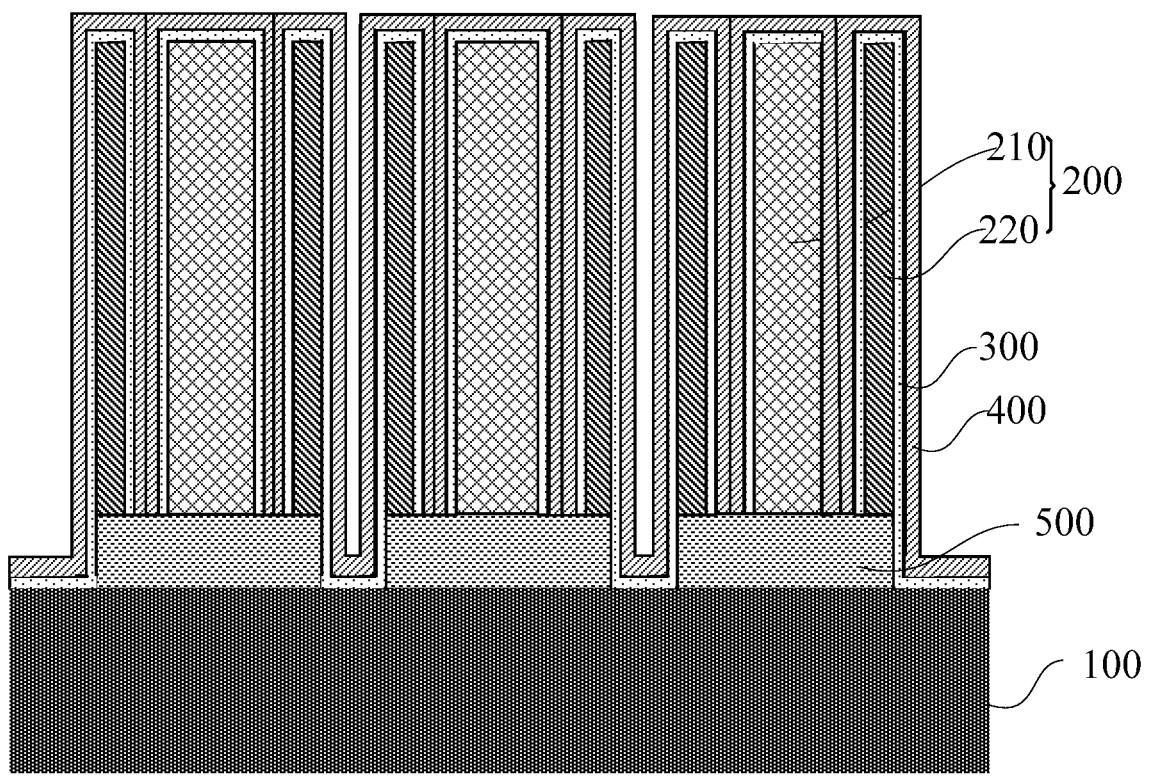

Referring to FIG. 14, after the capacitor dielectric layer 300 is formed, titanium nitride material is deposited by using the deposition process to form the top electrode 400 which covers the surface of the capacitor dielectric layer 300. The bottom electrode 200 (including the first conductive structure 210 and the second conductive structure 220) and the top electrode 400 together form the capacitor structure.

Based on the same inventive concept, one further embodiment provides a capacitor structure formed by using the above method, referring to FIG. 14 again. The capacitor structure includes a substrate 100, a bottom electrode 200, a capacitor dielectric layer 300, and a top electrode 400.

The bottom electrode 200 includes a first conductive structure 210 and a second conductive structure 220 which are located on a surface of the substrate 100. The first conductive structure 210 is columnar. The second conductive structure 220 surrounds the first conductive structure 210 and is spaced with the first conductive structure 210.

The capacitor dielectric layer 300 is located on the surface of the substrate 100 and the surface of the bottom electrode 200.

The top electrode 400 is located on the surface of the capacitor dielectric layer 300.

In the embodiment, since the columnar first conductive structure 210 is relatively straight and is relatively large in size and has a high bearing capability, the columnar first conductive structure will not collapse or bend in a subsequent manufacturing procedure. Moreover, the subsequently formed top/bottom electrode 200 may be prevented from collapsing or bending caused by pressing. In addition, the top electrode 400, the bottom electrode 200, and the capacitor dielectric layer 300 together form a Three-Dimensional (3D) columnar capacitor, so that the relative area between the top electrode 400 and the bottom electrode 200 may be effectively increased, and accordingly the capacitance of the capacitor structure is increased.

In one embodiment, the first conductive structure 210 is cylindrical. The diameter of the bottom surface of the first conductive structure 210 is 30 nm-50 nm.

It will be understood that the first conductive structure 210 with a cylindrical shape is beneficial to increase the number of the capacitor structure in the capacitor structure. In other embodiments, a cross-section of the first conductive structure 210 may be rectangle, square, triangle, or irregularly shape. In the embodiment, generally, the organic mask material layer and the hard mask material layer are etched by using a vertically crossed strip-shaped mask structure as a hard mask to form the through-hole. However, due to the limitation of the etching process, the cross section of the through-hole formed thereby is typically circular during pattern transferring. In addition, by controlling the diameter of the bottom surface of the first conductive structure 210 to be in the range of 30 nm-50 nm, the first conductive structure 210 is prevented from bending or collapsing due to excessive thinness, and the capacitance of the capacitor structure is increased maximally.

In one embodiment, the thickness of the second conductive structure 220 is 2 nm-8 nm.

In one embodiment, the capacitor structure further includes a capacitor contact pad 500. The capacitor contact pad 500 is located between the substrate 100 and the bottom electrode 200. The bottom electrode 200 is electrically connected with the capacitor contact pad 500. In the embodiment, by means of the capacitor contact pad 500, the contact resistance between the capacitor structure and the substrate 100 may be reduced.

In one embodiment, the height of the top of the bottom electrode 200 relative to the substrate 100 is 500 nm-800 nm. It will be understood that the relative area between the top electrode 400 and the bottom electrode 200 may also be increased by increasing the height of the electrode, thereby increasing the capacitance of the capacitor structure. In addition, by controlling the height of the top of the bottom electrode 200 relative to the substrate 100 in the range of 500 nm-800 nm, the size of a memory is reduced while the capacitance of the capacitor structure is maintained to be relatively large as much as possible.

In one embodiment, the capacitor dielectric layer 300 is further located on the side surface of the capacitor contact pad 500 and the region between adjacent capacitor contact pads, thereby insulating the top electrode 400 from the capacitor contact pad 500 and the substrate 100, and preventing contact leakage between the top electrode 400 and the capacitor contact pad and/or between the top electrode 400 and the substrate 100.

In one embodiment, the capacitor dielectric layer 300 is formed by the dielectric material having the dielectric constant greater than 7. In the embodiment, the dielectric material having the dielectric constant of greater than 7 is used to form the capacitor dielectric layer 300, so as to increase the capacitance by increasing the dielectric coefficient of the capacitor dielectric layer 300 between the top electrode 400 and the bottom electrode 200. The common high-K dielectric material includes $Ta_2O_5$, $TiO_2$, $Al_2O_3$, $Pr_2O_3$, $La_2O_3$, $LaAlO_3$, $HfO_2$, $ZrO_2$, or metal oxides of other components.

In one embodiment, the thickness of the capacitor dielectric layer 300 is 2 nm-12 nm.

Based on the same inventive concept, one further embodiment provides a memory. The memory uses the capacitor structure as described in any of the above embodiments. The memory further includes: a transistor (not shown in figures) formed on a surface of the substrate 100, and a capacitor contact structure (not shown in figures) having one end connected with the transistor and another end connected with the bottom of the bottom electrode 200.

In the description of the disclosure, the reference terms "some embodiments", "other embodiments", "ideal embodiments" and the like means that a specific feature, structure, material, or feature described with reference to the embodiments or examples is included in at least one embodiment or example of the present application. In the specification, the schematic descriptions on the above terms unnecessarily refer to the same embodiment or example.

The technical features of the above embodiments may be combined freely. In order to describe briefly, the descriptions are not made on all possible combinations of the technical features of the embodiments. However, the combinations of these technical features should be construed as falling into a scope of the specification as long as there is no conflict.

The above embodiments only describe several implementation modes of the present application. The description is specific and detailed, but cannot be understood as a limit to a scope of the invention patent application. It should be noted that one person having ordinary skill in the art may further make multiple changes and modifications without departing from a concept of the present application and those also belong to the protection scope of the present application. Therefore, the protection scope claimed by the present application shall be defined by the appended claims.

The invention claimed is:

1. A method of manufacturing a capacitor structure, comprising:
   providing a substrate;
   forming a first conductive structure with a shape of column on the substrate;
   forming a second conductive structure on the substrate, wherein the second conductive structure surrounds the first conductive structure and is spaced with the first conductive structure, a cross-section of the second conductive structure is annular, and the first conductive structure and the second conductive structure together form a bottom electrode;
   forming a capacitor contact pad, wherein the capacitor contact pad is located between the substrate and the bottom electrode, the bottom electrode is electrically connected with the capacitor contact pad, both of the first conductive structure and the second conductive structure are landing on a top surface of a same capacitor contact pad, and a width of the capacitor contact pad is equal to a width of the second conductive structure;
   forming a capacitor dielectric layer, wherein the capacitor dielectric layer covers a surface of the substrate and a surface of the bottom electrode; and
   forming a top electrode covering a surface of the capacitor dielectric layer.

2. The method of claim 1, wherein the forming a second conductive structure on the substrate comprises:
   forming a sacrificial material layer, wherein the sacrificial material layer covers a side surface of the first conductive structure;
   forming a second conductive material layer covering a side surface of the sacrificial material layer; and
   removing the sacrificial material layer located on the side surface of the first conductive structure, wherein the second conductive material layer which remains, is used as the second conductive structure.

3. The method of claim 2, wherein the sacrificial material layer on the side surface of the first conductive structure is removed by using a wet etching process.

4. The method of claim 1, wherein the first conductive structure is formed by using a polycrystalline silicon material.

5. The method of claim 1, wherein a material of forming the second conductive structure and the top electrode is one or more of titanium, titanium nitride, or tungsten.

6. The method of claim 1, wherein the forming a first conductive structure with a shape of column on the substrate comprises:
   forming a first conductive material layer on the surface of the substrate;
   forming a hard mask layer on the first conductive material layer, wherein the hard mask layer has a first graphical target pattern defining the first conductive structure; and
   etching the first conductive material layer with the hard mask layer as a mask to form a plurality of first conductive structures of which each one has with a shape of column.

7. The method of claim 2, wherein prior to forming the first conductive structure, the method further comprises forming a capacitor contact material layer covering the surface of the substrate; and
   after forming the first conductive structure, the sacrificial material layer, and the second conductive structure on the capacitor contact material layer, etching the capacitor contact material layer until the substrate is exposed, wherein the capacitor contact material layer which remains, forms the capacitor contact pad, and positions and number of capacitor contact pads correspond to those of first conductive structures in a one-to-one manner.

8. The method of claim 1, wherein the capacitor dielectric layer is formed by a dielectric material having a dielectric constant greater than 7.

9. A capacitor structure, comprising:
a substrate;
a bottom electrode, comprising a first conductive structure and a second conductive structure which are located on a surface of the substrate, wherein the first conductive structure has a shape of column, and the second conductive structure surrounds the first conductive structure and is spaced with the first conductive structure, wherein a cross-section of the second conductive structure is annular;
a capacitor dielectric layer, located on the surface of the substrate and a surface of the bottom electrode; and
a top electrode, located on a surface of the capacitor dielectric layer;
a capacitor contact pad, wherein the capacitor contact pad is located between the substrate and the bottom electrode, the bottom electrode is electrically connected with the capacitor contact pad, both of the first conductive structure and the second conductive structure are landing on a top surface of a same capacitor contact pad, and a width of the capacitor contact pad is equal to a width of the second conductive structure.

10. The capacitor structure of claim 9, wherein the first conductive structure is cylindrical, and a diameter of a bottom surface of the first conductive structure is 30 nm-50 nm.

11. The capacitor structure of claim 9, wherein the capacitor dielectric layer is further located on a side surface of the capacitor contact pad and in a region between two adjacent capacitor contact pads.

12. The capacitor structure of claim 9, wherein a height of a top of the bottom electrode relative to the substrate is 500 nm-800 nm.

13. The capacitor structure of claim 9, wherein the capacitor dielectric layer is formed by a dielectric material having a dielectric constant greater than 7.

14. A memory, comprising:
the capacitor structure of claim 9;
a transistor, formed on a surface of the substrate; and
a capacitor contact structure, wherein one end of the capacitor contact structure is connected with the transistor, and another end of the capacitor contact structure is connected with a bottom of the bottom electrode in the capacitor structure.

* * * * *